United States Patent
Croy et al.

(10) Patent No.: US 8,203,845 B2
(45) Date of Patent: Jun. 19, 2012

(54) ELECTRONICS CARD COMPRISING A PRINTED CIRCUIT BOARD AND A PIECE OF EQUIPMENT CARRIED BY THE BOARD

(75) Inventors: Jean-Luc Croy, Limeil Brev Annes (FR); Robert Arnould, Sardon (FR); Geneviève Gràndjean, Marly le Roi (FR); Benoît Box, Parmain (FR); Jean-Marie Bariller, Sable sur Sarthe (FR); Hervé Mathieu, Vandrimare (FR)

(73) Assignee: Johnson Controls Technology Company, Holland, MI (US)

( * ) Notice: Subject to any disclaimer, the term of this patent is extended or adjusted under 35 U.S.C. 154(b) by 631 days.

(21) Appl. No.: 12/351,658

(22) Filed: Jan. 9, 2009

(65) Prior Publication Data
US 2009/0181562 A1 Jul. 16, 2009

(30) Foreign Application Priority Data

Jan. 10, 2008 (DE) .......................... 10 2008 003 750
Oct. 30, 2008 (FR) ...................................... 08 06033

(51) Int. Cl.
*H05K 7/00* (2006.01)
(52) U.S. Cl. ........... 361/760; 361/769; 439/83; 439/575

(58) Field of Classification Search .................. 361/760, 361/767, 768, 769, 772; 439/55, 66, 65, 439/83, 78, 571, 572, 566, 575
See application file for complete search history.

(56) References Cited

U.S. PATENT DOCUMENTS

| | | | | |
|---|---|---|---|---|
| 3,066,367 | A * | 12/1962 | Garman | 248/222.11 |
| 5,117,330 | A * | 5/1992 | Miazga | 361/760 |
| 5,186,634 | A * | 2/1993 | Thompson | 439/82 |
| 6,837,755 | B1 * | 1/2005 | Kitajima et al. | 439/830 |
| 2001/0002624 | A1 * | 6/2001 | Khandros et al. | 174/250 |
| 2002/0030602 | A1 * | 3/2002 | Johnson et al. | 340/825.36 |
| 2002/0142648 | A1 * | 10/2002 | Buccinna et al. | 439/500 |
| 2003/0173111 | A1 * | 9/2003 | Frutschy et al. | 174/260 |
| 2006/0197647 | A1 * | 9/2006 | Whitney et al. | 337/297 |

\* cited by examiner

*Primary Examiner* — Hoa C Nguyen
(74) *Attorney, Agent, or Firm* — Muncy, Geissler, Olds & Lowe, PLLC

(57) ABSTRACT

The invention relates to an electronics card (1) comprising a printed circuit board (2) and a piece of equipment (3) such as a motor or a loudspeaker fastened to said printed circuit board (2). The piece of equipment (3) is fastened to a face (4) of the printed circuit board (2) by snap-fastening in metal clips (6, 7) that project from said face (4), each clip (6, 7) having a first end (8, 9) fastened to said face (4) of the printed circuit board (2) by soldering, and a second end (11, 12) bearing resiliently on a corresponding portion of the piece of equipment (3) for holding it pressed against said face (4) of the printed circuit board (2). The invention applies in particular to electronics cards for motor vehicles.

6 Claims, 1 Drawing Sheet

ELECTRONICS CARD COMPRISING A PRINTED CIRCUIT BOARD AND A PIECE OF EQUIPMENT CARRIED BY THE BOARD

The invention relates to an electronics card comprising a printed circuit board carrying a piece of equipment such as a motor or a loudspeaker that is fastened to said board.

BACKGROUND OF THE INVENTION

Such an electronics card may form part of a motor vehicle tachometer with a pointer display, or the like. The electronics card comprises a printed circuit board with electrical tracks and carrying firstly electronic components that are electrically connected to one another by said electrical tracks to which they are soldered, and secondly a piece of equipment such as a stepper motor that is powered and controlled by the printed circuit while also being carried thereby.

Specifically, the printed circuit together with its electronic components serve to process the signal needed for powering the stepper motor that carries the pointer of the tachometer, so as to place said pointer continuously in an angular position that is representative of the actual speed of the vehicle.

When fabricating such an electronics card, the electronic components are soldered to the tracks of the printed circuit board using a so-called reflow method. Under such circumstances, the solder is initially placed on the printed circuit board at the soldering locations prior to placing the electronic components on the board. The assembly is then inserted into an oven, thereby causing the terminals of each of the electronic components to be soldered to the tracks of the printed circuit.

Since a piece of equipment such as a motor includes portions made of plastics material that cannot withstand the temperatures of a reflow oven, such a motor is fastened in a separate operation.

Under such circumstances, the motor is placed on the printed circuit board by engaging its pins in holes that pass through the board, and then the pins are subsequently soldered to connect them electrically to the tracks of the printed circuit board, while also rigidly securing the motor to the board.

This operation of soldering the pins of the motor is generally performed by a soldering operation known as "wave (or flow)" soldering, during which molten solder is brought into contact with each pin for soldering so as to solder it to the corresponding track.

OBJECT OF THE INVENTION

The object of the invention is to propose a solution for simplifying the above fabrication method.

SUMMARY OF THE INVENTION

To this end, the invention provides an electronics card comprising a printed circuit board and a piece of equipment such as a motor or a loudspeaker fastened to said printed circuit board, wherein the piece of equipment is fastened to a face of the printed circuit board by snap-fastening in metal clips that project from said face, each clip having a first end fastened to said face of the printed circuit board by soldering, and a second end bearing resiliently on a corresponding portion of the piece of equipment for holding it pressed against said face of the printed circuit board.

With this operation, the wave (or flow) soldering operation is no longer needed for fastening the piece of equipment to the printed circuit board: the clips are fastened to the printed circuit board by soldering during the reflow operation, at the same time as the other electronic components are fastened thereto. The piece of equipment is then mounted merely by an operation of snap-fastening the piece of equipment in the clips.

The invention also provides an electronics card as defined above, wherein at least one clip has its first end soldered to an electrical track of the printed circuit board and its second end bearing against a terminal of the piece of equipment in order to serve also as an electrical contact between the terminal and the track.

The invention also provides an electronics card as defined above, wherein each clip is fabricated from a piece of sheet metal of generally rectangular outline that is curved to form a clip.

The invention also provides an electronics card as defined above, wherein each clip is curved to present a section of a shape corresponding to the shape of the letter S or of the letter Z.

The invention also provides an electronics card as defined above, wherein the piece of equipment is an electric motor having a cylindrical body presenting a generally plane base bearing against a face of the printed circuit board and a circular groove in its cylindrical side surface, each second end of a clip being engaged in the circular groove to hold the motor bearing against the face of the printed circuit board that carries it.

The invention also provides an electronics card as defined above, wherein the piece of equipment has a bearing face provided with at least one positioning tab projecting from said face and designed to engage in a corresponding hole in the printed circuit board to position the piece of equipment on the printed circuit board, the clips serving to hold the piece of equipment pressed against a face of the printed circuit board.

The invention also provides a method of fastening a piece of equipment such as a motor or a loudspeaker to a printed circuit board, wherein the piece of equipment is secured to the printed circuit board by being clipped in metal clips previously fastened to the printed circuit board by soldering.

DETAILED DESCRIPTION OF THE INVENTION

The basic idea of the invention is to solder clips to the printed circuit card thereby enabling the equipment that the card is to carry to be mounted thereon subsequently merely by clip-fastening. The method of fabrication is thus simplified by eliminating the operation of wave (or flow) soldering.

Figure 1:
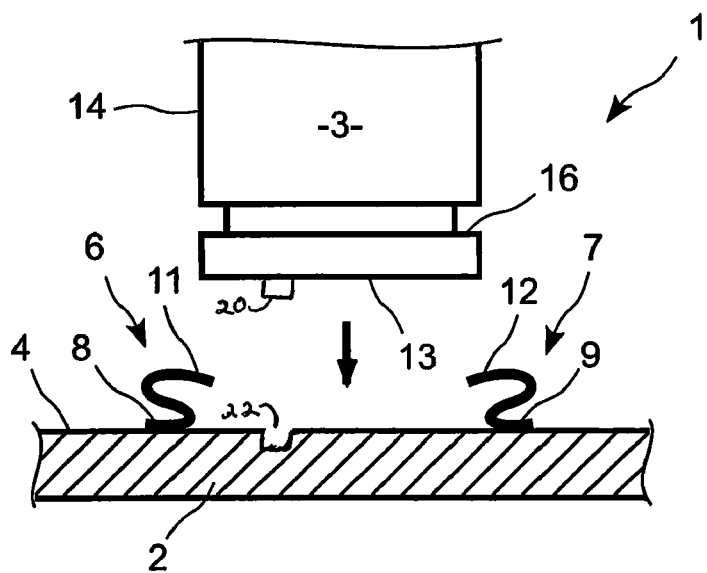
FIG. 1 is a diagrammatic side view in section of the electronics card of the invention prior to equipment being mounted thereon.

As shown in FIG. 1, the electronics card of the invention, referenced 1, comprises a printed circuit board 2 together with a piece of equipment 3, here a stepper type motor that is for fastening to a top face 4 of the printed circuit board 2.

The top face of the board 2 has electronic tracks to which the tabs of electronic components (not shown) are soldered, for example surface-mount components (SMCs) that can be soldered to the board 2 by a so-called reflow operation.

As can be seen in the figures, the top face 4 also carries clips referenced 6 and 7, each presenting a first end with respective reference 8 or 9, and a second end with respective reference 11 or 12.

The clips 6 and 7 are fastened to the top face 4 at the same time as the electronic components, during the reflow operation, in which operation each first end 8 and 9 is soldered to a track or to a metal portion of the top face 4 of the printed circuit board 2.

Figure 2:
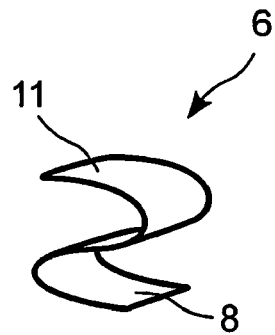
FIG. 2 is a diagrammatic perspective view showing a clip of the electronics card of the invention.

For this purpose, each clip is made of a metal material suitable for enabling it to be fastened by reflow soldering. As can be seen in FIG. 2, for this purpose, each clip is made from a rectangular plate of small dimensions that is curved so that it presents a shape in side view that corresponds to the shape of the letter S or the shape of the letter Z. The ends of the clip are plane and thus extend in directions that are substantially parallel at the end of this forming operation.

Before the reflow operation, each clip 6, 7 is placed by a machine on the top face 4 of the board 2 in register with a previously-deposited solder pad, bearing thereagainst via the bottom face of its first end, respectively 8 or 9. The clip is then soldered via said face in this position after passing through the oven, the clips 6 and 7 thus being soldered onto the top face in such a manner that their second ends 11 and 12 are spaced apart from each other by a distance that is slightly shorter than the diameter of the body of the motor 3.

As can be seen in the figures, the motor 3 has a body that is generally cylindrical, presenting a generally plane bearing face or base 13 and a cylindrical side face 14 that is provided with a circular groove 16, situated at a predetermined distance from the bearing face 13.

As can be seen in the figures, the height of each clip 6 and 7, i.e. the distance between the first end and the second end of each clip, is slightly smaller than the distance between the circular groove 16 and the bottom face 13.

For the motor, the mounting operation proper consists merely in clipping it in the clips previously soldered onto the top face 4 of the board 2, by pushing the motor down towards said top face 4. This movement has the effect of splaying apart the second ends 11 and 12 until they retract to engage in the circular groove 16.

Figure 3:
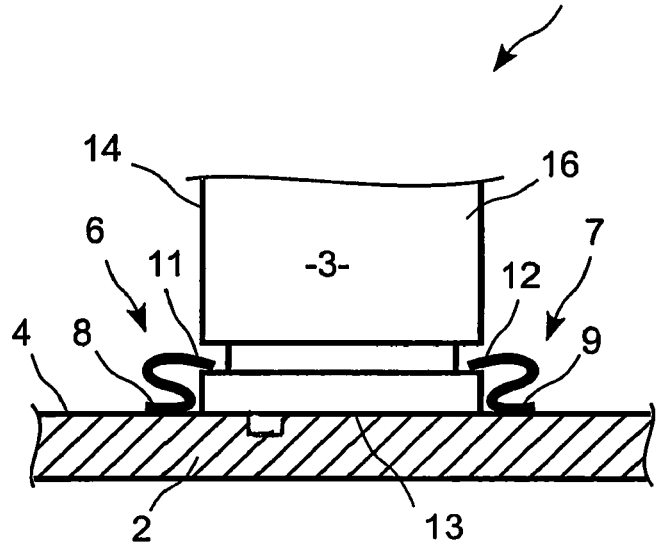
FIG. 3 is a diagrammatic side view in section of the electronics card of the invention after the motor has been mounted on the printed circuit board.

Once this operation has been accomplished, which corresponds to the situation shown in FIG. 3, the motor has its bottom face or base 13 held pressed against the top face 4 by the clips 6 and 7 engaged in the groove 16.

The second ends of the clips may advantageously be rounded in shape so as to splay spontaneously apart from each other when the motor is pushed towards the board 2 so as to facilitate clip-fastening.

Given the flexibility of the clips 6 and 7, their second ends move spontaneously towards each other once they are in register with the groove 16 so as to engage therein.

Advantageously, the motor is designed so that each second end comes to bear on an electrical power supply terminal or a control terminal of the motor, which terminals are provided in the groove 16 in the example shown in the figures. Thus, clip-fastening the motor serves not only to fasten the motor mechanically to the board 2, but also to connect it electrically with the tracks on the board so as to power the motor and/or control it.

Specifically, the resilience of the clips 6 and 7 ensures that their second ends exert a force on the electrical terminals against which they bear so as to achieve electrical contact that is durable. By way of example, the motor may have four electrical terminals corresponding to its power supply and to its control, each terminal being designed to receive the second end of a respective clip-fastening clip.

In addition to the clips 6 and 7 that serve to hold the motor 3 pressed against the top face 4 of the board 2, the bottom face 13 of the motor can be provided with one or more centering studs 20 that project beyond said face so as to engage in corresponding holes 22 in the board 2, in order to ensure that the motor is accurately positioned relative to the board.

As an indication, the stepper motor 3 of the figures has a diameter of about thirty-six millimeters, and its groove has a depth of about one millimeter, being situated at five millimeters from the base 13. Each clip 6, 7 is made from a piece of metal that is about two-tenths of a millimeter thick, having a rectangular outline with sides measuring respectively ten millimeters and one to two millimeters. Once the clips 6 and 7 have been curved and soldered to the board, they present a height relative to the board of about five millimeters and a width of less than five millimeters.

In the example in the figures, the equipment carried by the board 2 is a stepper type motor, as corresponds to a tachometer, a fuel gauge, a dashboard clock, or even an electronic compass. However the invention is equally applicable to other types of electric motor and to other types of equipment.

In particular, the invention applies to fastening a loudspeaker, or a member capable of emitting electronic sounds such as beeps, to fastening an electronic connector carried by the board, or indeed to fastening a fastener enabling the board to be secured to a mechanical support.

What is claimed is:

1. An electronics card (1) comprising a printed circuit board (2) and a piece of equipment (3) including a motor fastened to said printed circuit board (2), wherein the piece of equipment (3) is fastened to a face (4) of the printed circuit board (2) by snap-fastening in metal clips (6, 7) that project from said face (4), each clip (6, 7) having a first end (8, 9) fastened to said face (4) of the printed circuit board (2) by soldering, and a second end (11, 12) bearing resiliently on a corresponding portion of the piece of equipment (3) for holding it pressed against said face (4) of the printed circuit board (2) and wherein the motor has a cylindrical body presenting a generally plane base (13) bearing against a face (4) of the printed circuit board (2) and a circular groove (16) in its cylindrical side surface (14), each second end (11, 12) of a clip (6, 7) being engaged in the circular groove (16) to hold the motor (3) bearing against the face (4) of the printed circuit board (2) that carries it.

2. An electronics card (1) according to claim 1, wherein at least one clip (6, 7) has its first end (8, 9) soldered to an electrical track of the printed circuit board (2) and its second end (11, 12) bearing against a terminal of the piece of equipment (3) in order to serve also as an electrical contact between the terminal and the track.

3. An electronics card (1) according to claim 1, wherein each clip (6, 7) is fabricated from a piece of sheet metal of generally rectangular outline that is curved to form a clip.

4. An electronics card (1) according to claim 3, wherein each clip (6, 7) is curved to present a section of a shape corresponding to the shape of the letter S or of the letter Z.

5. An electronics card according to claim 1, wherein the piece of equipment (3) has a bearing face (13) provided with at least one positioning tab projecting from said face and designed to engage in a corresponding hole in the printed circuit board (2) to position the piece of equipment (3) on the printed circuit board (2), the clips (6, 7) serving to hold the piece of equipment (3) pressed against a face (4) of the printed circuit board (2).

6. A method of fastening a piece of equipment (3) including a motor to a printed circuit board (2), wherein the piece of equipment (3) is secured to the printed circuit board (2) by being clipped in metal clips (6, 7) previously fastened to the printed circuit board (2) by soldering and wherein the motor has a cylindrical body presenting a generally plane base (13) bearing against a face (4) of the printed circuit board (2) and a circular groove (16) in its cylindrical side surface (14), each second end (11, 12) of a clip (6, 7) being engaged in the circular groove (16) to hold the motor (3) bearing against the face (4) of the printed circuit board (2) that carries it.

\* \* \* \* \*